United States Patent
Chang et al.

(10) Patent No.: US 7,785,923 B2
(45) Date of Patent: Aug. 31, 2010

(54) PHASE CHANGE MEMORY DEVICE PREVENTING CONTACT LOSS AND METHOD FOR MANUFACTURING THE SAME

(75) Inventors: Heon Yong Chang, Gyeonggi-do (KR); Sang Heon Kim, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 12/211,239

(22) Filed: Sep. 16, 2008

(65) Prior Publication Data

US 2009/0200537 A1      Aug. 13, 2009

(30) Foreign Application Priority Data

Feb. 12, 2008  (KR) ...................... 10-2008-0012716

(51) Int. Cl.
*H01L 21/06* (2006.01)
(52) U.S. Cl. .................. 438/102; 438/95; 438/482; 438/618
(58) Field of Classification Search .............. 438/102, 438/95, 482, 618
See application file for complete search history.

(56) References Cited

U.S. PATENT DOCUMENTS

2008/0280440 A1* 11/2008 Chang .................. 438/684

FOREIGN PATENT DOCUMENTS

| KR | 1020010057490 A | 7/2001 |
| KR | 1020060110559 A | 10/2006 |
| KR | 10-0689831 B1 | 2/2007 |
| KR | 10-0782496 B1 | 11/2007 |

* cited by examiner

*Primary Examiner*—Long Pham
(74) *Attorney, Agent, or Firm*—Ladas & Parry LLP

(57) ABSTRACT

A phase change memory device includes a silicon substrate having a phase change cell region. A plurality of phase change cell are formed in the phase change region of the silicon substrate. A contact comprising a first contact and a second contact is formed on each of the phase change cells. A plurality of bit lines are electrically connected to the contacts. A contact plug is formed on the silicon substrate in a region outside of the phase change cell region, and a word line is formed over the silicon substrate and is connected to the contact plug.

7 Claims, 5 Drawing Sheets

PHASE CHANGE MEMORY DEVICE PREVENTING CONTACT LOSS AND METHOD FOR MANUFACTURING THE SAME

CROSS-REFERENCE TO RELATED APPLICATIONS

The present application claims priority to Korean patent application number 10-2008-0012716 filed on Feb. 12, 2008, which is incorporated herein by reference in its entirety.

BACKGROUND OF THE INVENTION

The present invention relates generally to a phase change memory device and a method for manufacturing the same, and more particularly, to a phase change memory device which can prevent contact loss and a method for manufacturing the same.

Memory devices can be generally grouped into volatile random access memory (RAM), which loses inputted information when power is interrupted; and a non-volatile read-only memory (ROM), which can continuously maintain the stored state of inputted information even when power is interrupted. Examples of volatile RAM include dynamic RAM (DRAM) and static RAM (SRAM); and examples of non-volatile ROM include flash memory devices such as electrically erasable and programmable ROM (EEPROM).

DRAM is well known as an excellent memory device. However, DRAM must have high charge storing capacity. To achieve high storage capacity the surface area of an electrode is often times increased, but the increased surface area makes it difficult to accomplish a high level of integration. Further, in a flash memory device two gates are typically stacked upon each other and require a high operation voltage relative to the power source voltage. Therefore, a separate booster circuit is necessary to supply the voltage required for write and delete operations, which in turn makes difficult to accomplish a high level of integration.

With these constraints in mind, it is highly desirable to develop a memory device having a simple configuration and capable of accomplishing a high level of integration while retaining the characteristics of a typical non-volatile memory device. Recently, phase change memory devices have been recognized as memory devices with the potential to achieve these characteristics.

In a phase change memory device in order to store information a phase change is imposed on a phase change layer interposed between a bottom electrode and a top electrode. The phase change is from a crystalline state to an amorphous state (or vise versa), and the phase change occurs when a current is caused to flow between the bottom electrode and the top electrode. The information stored in a cell is recognized using the difference in the level of resistance between the crystalline state and the amorphous state of the phase change material.

Furthermore, one of the most important factors when developing highly integrated phase change memory devices is to secure programming current. One way of securing programming current is to adopt PN diodes as switching elements in the phase change memory device. A phase change memory device having adopted the PN diodes provides advantages including improved current flow when compared to a CMOS (complementary metal-oxide semiconductor) transistor. With the improved current flow, it is possible to secure programming current, and additionally the size of cells can be decreased in comparison to a DRAM or a flash memory device.

In a typical phase change memory device, top electrode contacts are formed on the top electrodes to connect the top electrodes to bit lines. The top electrode contacts are formed simultaneously with the bit lines and have a thickness of approximately 5,000 Å.

This thickness (approximately 5,000 Å) is substantial, and thus etch loss is likely to occur in the top electrodes. If the overlap between the top electrodes and the top electrode contacts deviates even slightly from a preset range, the sidewalls of a phase change layer can be etched.

As a result, the material for top electrode contacts may not be appropriately deposited, leading to an open circuit between the bit lines and the top electrodes.

SUMMARY OF THE INVENTION

Embodiments of the present invention are directed to a phase change memory device which allows contacts to be formed in a stable manner, and a method for manufacturing the same.

In one aspect of the present invention, a phase change memory device includes contacts for connecting top electrodes to bit lines, wherein the contacts are formed on the top electrodes to have a stack structure of a first contact and a second contact.

In another aspect of the present invention, a phase change memory device comprises phase change cells formed in a phase change cell region of a silicon substrate; contacts formed on the phase change cells to have a stack structure of a first contact and a second contact; bit lines formed to be connected to the contacts; a contact plug formed in a region outside the phase change cell region of the silicon substrate; and a word line formed to be connected with the contact plug.

The phase change cell is composed of a stack pattern of a switching element, a phase change layer, and a top electrode.

The switching element comprises a vertical PN diode.

The phase change cell further includes a thin film for heaters, which is formed to connect the switching element and the phase change layer to each other.

In one aspect, the first contact and the second contact can have the same width. Alternatively, the first contact may have a width greater than the width of the second contact.

The contact plug is composed of a stack structure of a first contact plug, a second contact plug, a third contact plug, and a fourth contact plug.

The contact plug further includes a pillar type first wiring line for connecting the second contact plug and the third contact plug with each other.

The contact plug further includes a pillar type second wiring line for connecting the third contact plug and the fourth contact plug with each other.

In still another aspect of the present invention, a method for manufacturing a phase change memory device comprises the steps of forming a plurality of switching elements in a phase change cell region of a silicon substrate; forming a first contact plug in a region outside the phase change cell region of the silicon substrate; forming stack patterns of a phase change layer and a top electrode on the switching elements; forming first top electrode contacts on top electrodes and forming a second contact plug on the first contact plug; forming second top electrode contacts on the first top electrode contacts and forming a third contact plug on the second contact plug; forming bit lines on the second top electrode contacts to be connected with the top electrodes; forming a fourth contact plug on the third contact plug; and forming a word line to be connected with the fourth contact plug.

The switching elements are formed as vertical PN diodes.

After the step of forming the switching elements and before the step of forming the stack patterns of the phase change layer and the top electrode, the method further comprises the step of forming a thin film for heaters, on the switching elements.

The first top electrode contacts may be formed to have the same width as the second top electrode contacts. Alternatively, the first top electrode contacts may be formed to have a width greater than that of the second top electrode contacts.

After the steps of forming the first top electrode contacts and the second top electrode contacts and before the step of forming the third contact plug, the method further comprises the step of forming a pillar type first wiring line on the second contact plug.

In the step of forming the bit lines, a pillar type second wiring line is formed on the third contact plug.

DESCRIPTION OF SPECIFIC EMBODIMENTS

In embodiments of the present invention, contacts for connecting top electrodes and bit lines are formed to have a stack structure including first contacts and second contacts. When forming the stack structure, it is possible to form the contacts more stably when compared to the conventional art, and it is possible to prevent the top electrodes and the phase change layer from being lost when forming the contacts.

In detail, in the present invention, first contacts are first formed on the top electrodes to decrease the thickness of the contacts, and then, second contacts are formed on the first contacts to complete the connection between the top electrodes and the bit lines. As such, the second contacts are formed after the first contacts (which allows the thickness of the contacts to be decreased), and this allows the contacts to be formed more stably when compared to the conventional art in which contacts are formed simultaneously with bit lines.

Hereafter, the specific embodiments of the present invention will be described in detail with reference to the accompanying drawings.

Figure 1:
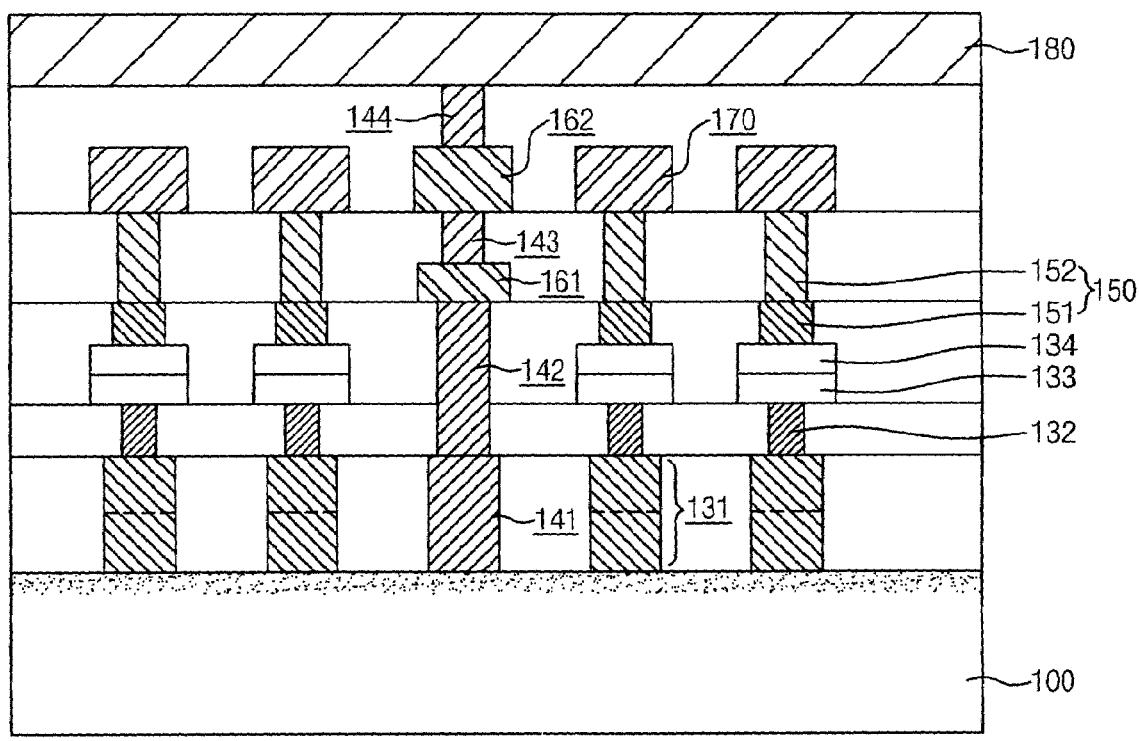
FIG. 1 is a cross-sectional view showing a phase change memory device according to an embodiment of the present invention.

FIG. 1 is a cross-sectional view showing a phase change memory device according to an embodiment of the present invention. Referring to FIG. 1, contacts 150 having a stack structure including a first contact 151 and a second contact 152 are formed on phase change cells comprising switching elements 131, a thin film 132 for heaters, a phase change layer 133, and top electrodes 134 in the phase change cell region of a silicon substrate 100. Bit lines 170 are formed on the second contacts 152 and are electrically connected to the phase change cells.

A contact plug is formed in a region outside the phase change cell region in the silicon substrate 100. That is, a contact plug comprising a first contact plug 141, a second contact plug 142, a third contact plug 143, and a fourth contact plug 144 is formed. A word line 180 is formed on the fourth contact plug 144 and is electrically connected to an impurity region 110 of the silicon substrate 100.

Reference numeral 161 designates a pillar type first wiring line, and reference numeral 162 designates a pillar type second wiring line.

FIGS. 2A through 2F are cross-sectional views shown for illustrating the processes of a method for manufacturing a phase change memory device according to an embodiment of the present invention. The method will be described below.

Figure 2A:
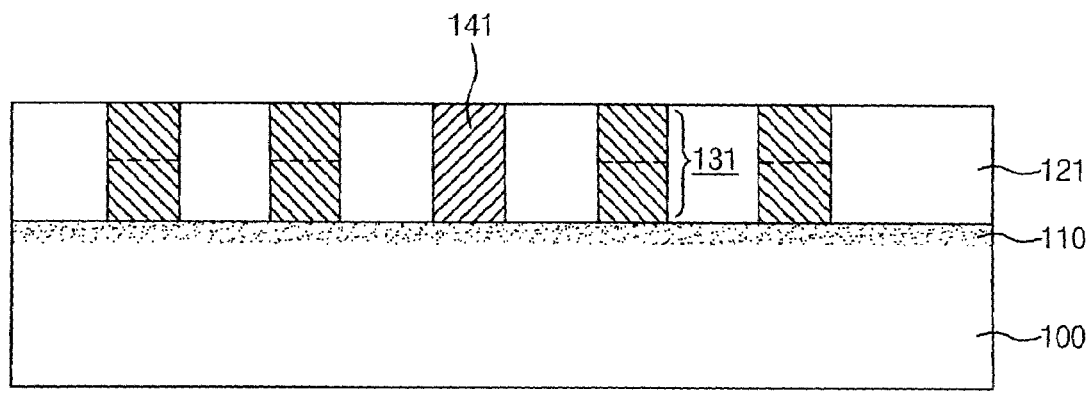
FIGS. 2A through 2H are cross-sectional views shown for illustrating the processes of a method for manufacturing a phase change memory device according to an embodiment of the present invention.

Referring to FIG. 2A, a first insulation layer 121 is deposited on a silicon substrate 100 having an active region formed with an N-type impurity region 110. Thereafter, the first insulation layer 121 is etched to define a plurality of first contact holes each exposing a portion of the phase change cell region of the active region. Vertical PN diodes 131 serving as switching elements are then formed in the first contact holes.

A second contact hole is defined in a region outside the phase change cell region of the silicon substrate 100 by etching the first insulation layer 121, and a first contact plug 141 is then formed in the second contact hole in order to provide an electrical connection between a subsequently formed word line and the N-type impurity region 110 of the silicon substrate 100.

Figure 2B:
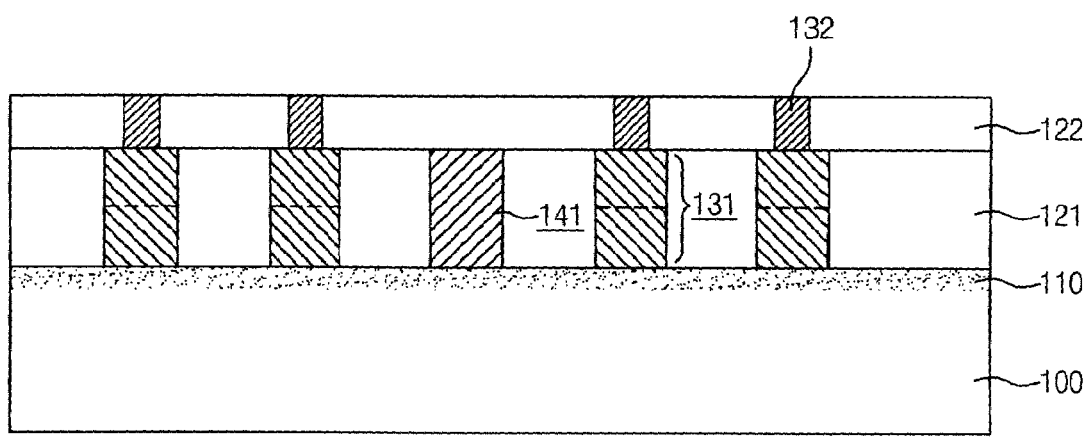

Referring to FIG. 2B, a second insulation layer 122 is deposited on the first insulation layer 121 including the vertical PN diodes 131 (which serve as switching elements) and the first contact plug 141. The second insulation layer 122 is then etched to define third contact holes each exposing a portion of a corresponding vertical PN diode 131. A thin film 132 for heaters is formed in the third contact holes to contact the vertical PN diodes 131.

Figure 2C:
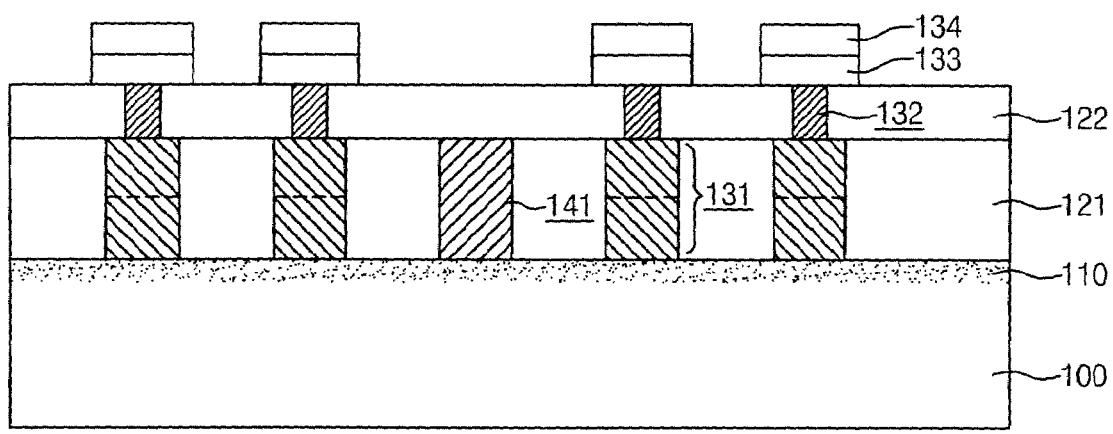

Referring to FIG. 2C, a phase change material and a top electrode material are deposited on the second insulation layer 122 including the thin film 132 for heaters. The phase change material and the top electrode material are etched to form a plurality of stack patterns each comprising a phase change layer 133 and a top electrode 134 and formed on a corresponding thin film 132 for a heater.

Figure 2D:
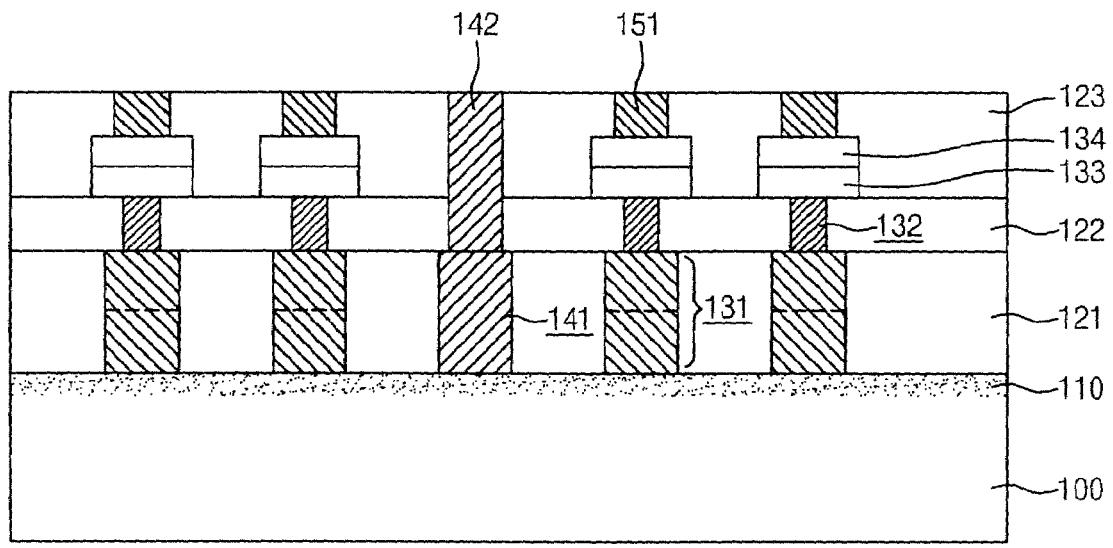

Referring to FIG. 2D, a third insulation layer 123 is deposited on the second insulation layer 122 to cover the stack patterns of the phase change layer 133 and the top electrode 134. Thereafter, fourth contact holes are defined in the third insulation layer 123 with each contact hole exposing the upper end of the corresponding top electrode 134. A fifth contact hole is defined in the second insulation layer 122 and the third insulation layer to expose the upper end of the first contact plug 141. The fourth contact holes and the fifth contact hole may be defined to simultaneously. Alternatively, the fifth contact hole may be defined after the fourth contact holes have already been defined. First contacts (hereinafter referred to as "first contacts for top electrodes") 151 are formed in the fourth contact holes to contact the top electrodes 134, and a second contact plug 142 is formed in the fifth contact hole to contact the first contact plug 141. The first contacts 151 for top electrodes are formed to a thickness less than 2,000 Å.

Figure 2E:
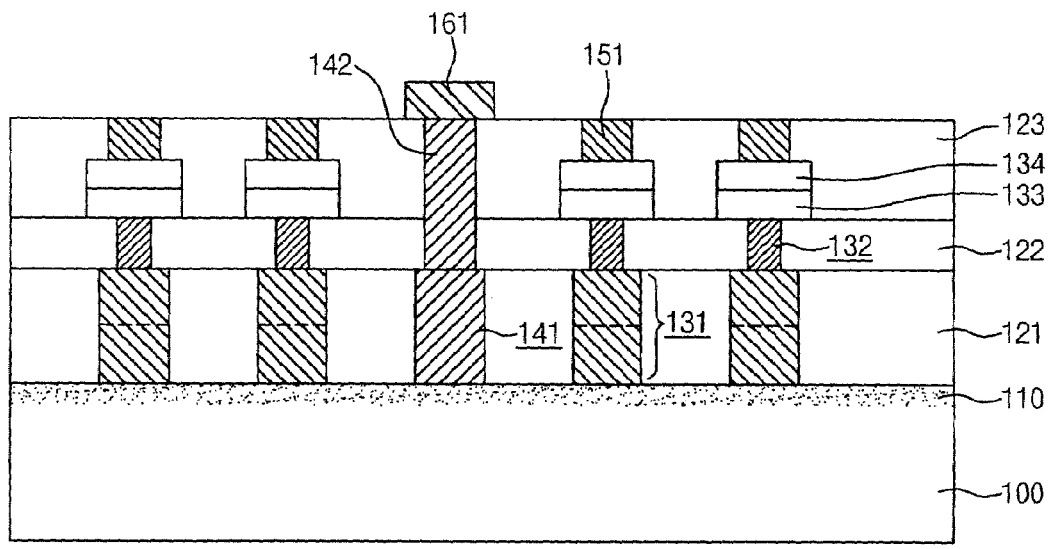

Referring to FIG. 2E, a pillar type first wiring line 161 is formed on the second contact plug 142. The pillar type first wiring line 161 serves to secure a process margin for a third contact plug which will be subsequently formed to contact the second contact plug 142. While not shown in the drawing, the pillar type first wiring line 161 serves to electrically connect the contacts together, which are formed in the source and drain areas of transistors in a peripheral region.

Figure 2F:
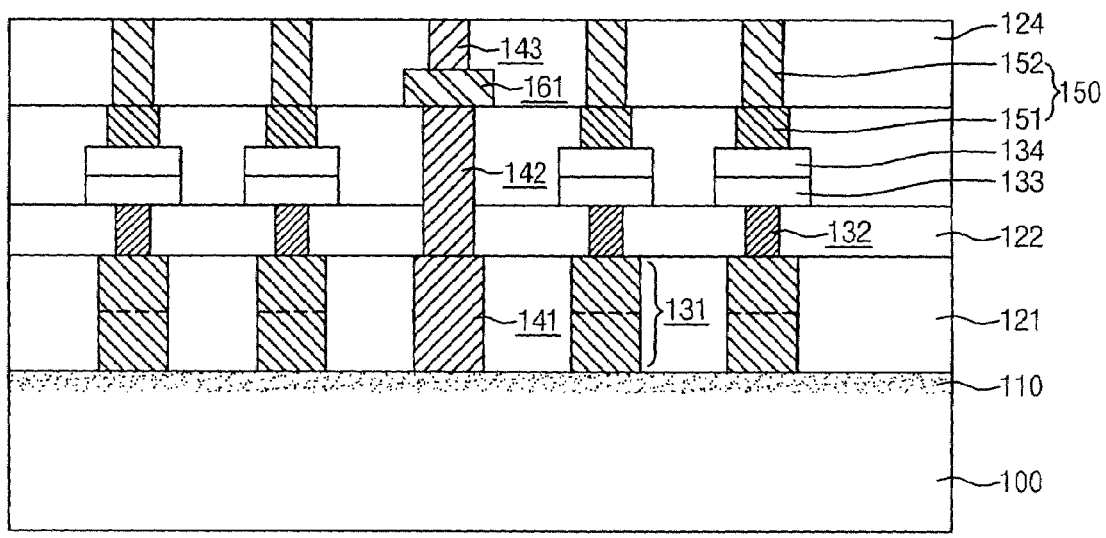

Referring to FIG. 2F, a fourth insulation layer 124 is deposited on the third insulation layer 123 to cover the first wiring line 161. Thereafter, sixth contact holes are defined in the third insulation layer 123 with each sixth contact hole exposing the upper end of the corresponding first contact 151 for top electrodes. A seventh contact hole is defined in the insulation layer 123 to expose the upper end of the pillar type first wiring line 161. By forming second contacts (hereinafter referred to as "second contacts for top electrodes") 152 in the sixth contact holes to contact the first contacts 151 for top electrodes, top electrode contacts 150 having a stack structure including the first contacts 151 for top electrodes and the second contacts 152 for top electrodes are completed. A third contact plug 143 is formed in the seventh contact hole to contact the pillar type first wiring line 161.

When the top electrode contacts 150 for connecting the top electrodes 134 with subsequently formed bit lines are composed of the stack structure including the first contacts 151 for top electrodes and the second contacts 152 for top electrodes, top electrodes contacts having a substantial thickness can be formed in a stable manner.

Figure 2G:
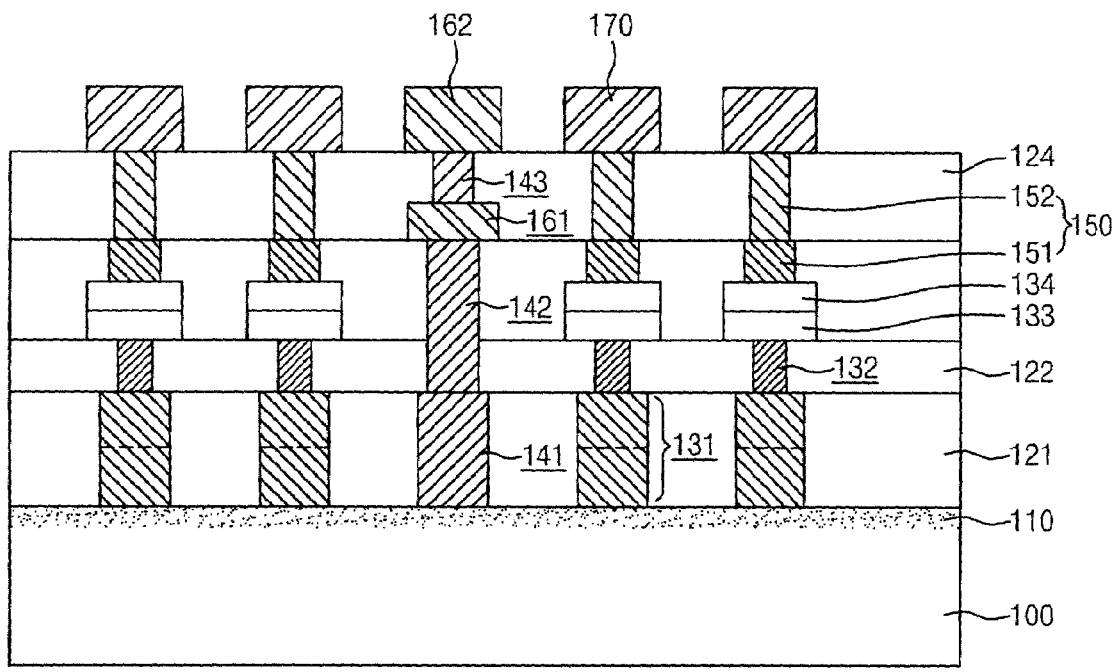

Referring to FIG. 2G, bit lines 170 are formed on respective top electrode contacts 150 such that a bit line 170 is connected to each top electrode contact 150. The bit lines 170 are formed in a direction perpendicular to the active region. When forming the bit lines 170, a pillar type second wiring line 162 is formed on the third contact plug 143. The pillar type second wiring line 162 serves to secure a process margin for a fourth contact plug which will be subsequently formed to contact the third contact plug 143.

Here, by the medium of the top electrode contacts 150 composed of the stack structure including the first contacts 151 for top electrodes and the second contacts 152 for top electrodes, the top electrodes 134 and the bit lines 170 are electrically connected to each other.

Figure 2H:
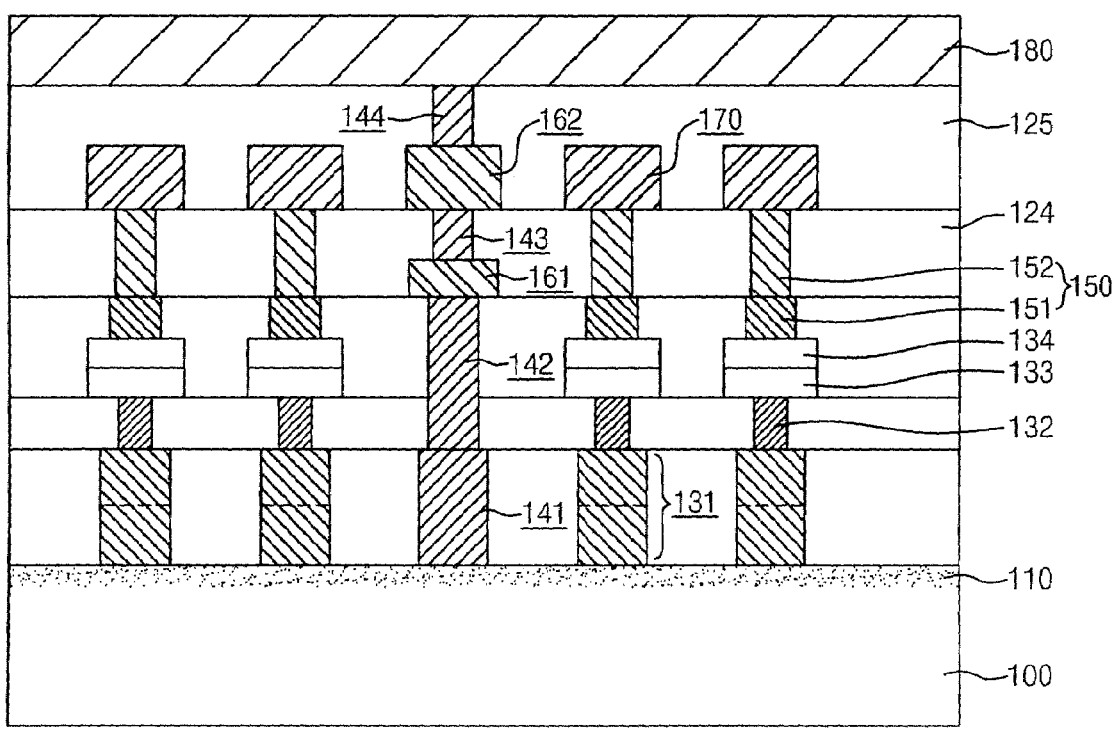

Referring to FIG. 2H, a fifth insulation layer 125 is deposited on the fourth insulation layer 124 to cover the bit lines 170 and the pillar type second wiring line 162. Thereafter an eighth is contact hole is defined in the fifth insulation layer 124 to expose the upper end of the pillar type second wiring line 162. Then, a fourth contact plug 144 is formed in the eighth contact hole to contact the third contact plug 143. Next, a word line 180 is formed on the fifth insulation layer 124 and is connected to each of the fourth contact plugs 144. The word line 180 is formed in the direction of the active region.

The word line 180 is electrically connected to the N-type impurity region 110 of the active region by way of the contact plug composed of the stack structure including the first contact plug 141, the second contact plug 142, the third contact plug 143, and the fourth contact plug 144.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A method for manufacturing a phase change memory device having a substrate with a phase change cell region, the method comprising the steps of:
    forming a plurality of switching elements in the phase change cell region of a substrate;
    forming a first contact plug on the substrate in a region outside the phase change cell region of the substrate;
    forming a plurality of stack patterns each comprising a phase change layer and a top electrode formed on any one of the switching elements;
    forming a plurality of first top electrode contacts each being formed on any one of the top electrodes;
    forming a second contact plug on the first contact plug;
    forming a plurality of second top electrode contacts each being formed on any one of the first top electrode contacts such that stack patterns of the first top electrode contacts and the second top electrode contacts are formed;
    forming a third contact plug on the second contact plug;
    forming a plurality of bit lines each being formed on any one of the second top electrode contacts and each being electrically connected to any one of the top electrodes by any one of the stack patterns of the first top electrode contacts and the second top electrode contacts;
    forming a fourth contact plug on the third contact plug; and
    forming a word line to be electrically connected to the fourth contact plug.

2. The method according to claim 1, wherein the switching elements are formed as vertical PN diodes.

3. The method according to claim 1, wherein;
    after the step of forming the switching elements and before the step of forming the stack patterns of the phase change layer and the top electrode, the method further comprises the step of:
        forming a thin film for heaters on the switching elements.

4. The method according to claim 1, wherein the first top electrode contacts are formed to have the same width as the second top electrode contacts.

5. The method according to claim 1, wherein the first top electrode contacts are formed to have a width greater than that of the second top electrode contacts.

6. The method according to claim 1, wherein:
    after the steps of forming the first top electrode contacts and the second top electrode contacts and before the step of forming the third contact plug, the method further comprises the step of:
        forming a pillar type first wiring line on the second contact plug.

7. The method according to claim 1, wherein, in the step of forming the bit lines, a pillar type second wiring line is formed on the third contact plug.

* * * * *